(12) United States Patent
Choi et al.

(10) Patent No.: US 10,510,632 B2
(45) Date of Patent: Dec. 17, 2019

(54) METHOD OF PACKAGING THIN DIE AND SEMICONDUCTOR DEVICE INCLUDING THIN DIE

(71) Applicant: STATS ChipPAC Pte. Ltd., Singapore (SG)

(72) Inventors: Won Kyoung Choi, Singapore (SG); Pandi Chelvam Marimuthu, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/919,401

(22) Filed: Mar. 13, 2018

(65) Prior Publication Data
US 2019/0287873 A1    Sep. 19, 2019

(51) Int. Cl.
| | |
|---|---|
| *H01L 21/44* | (2006.01) |
| *H01L 21/48* | (2006.01) |
| *H01L 21/50* | (2006.01) |
| *H01L 23/31* | (2006.01) |
| *H01L 23/538* | (2006.01) |
| *H01L 21/768* | (2006.01) |
| *H01L 25/00* | (2006.01) |
| *H01L 21/56* | (2006.01) |

(52) U.S. Cl.
CPC ........ *H01L 23/3128* (2013.01); *H01L 21/568* (2013.01); *H01L 21/76802* (2013.01); *H01L 23/5384* (2013.01); *H01L 25/50* (2013.01)

(58) Field of Classification Search
CPC ............... H01L 23/3128; H01L 21/568; H01L 21/76802

USPC .......................................................... 438/106
See application file for complete search history.

(56) References Cited

U.S. PATENT DOCUMENTS

| | | | |
|---|---|---|---|
| 8,786,060 B2* | 7/2014 | Yen | H01L 23/552 |
| | | | 257/660 |
| 9,685,350 B2 | 6/2017 | Lin et al. | |
| 9,768,155 B2 | 9/2017 | Lin et al. | |
| 9,806,040 B2 | 10/2017 | Liu et al. | |
| 2016/0351419 A1 | 12/2016 | Lin et al. | |
| 2017/0154838 A1 | 6/2017 | Kim et al. | |
| 2019/0027465 A1* | 1/2019 | Yeh | H01L 25/50 |

* cited by examiner

*Primary Examiner* — David S Blum
(74) *Attorney, Agent, or Firm* — Brian M. Kaufman; Robert D. Atkins; Patent Law Group: Atkins and Associates, P.C.

(57) ABSTRACT

A semiconductor device has a carrier and a semiconductor die disposed over the carrier. A dummy die is disposed over the carrier as well. A first encapsulant is deposited over the semiconductor die and dummy die. The dummy die and a first portion of the first encapsulant is backgrinded while a second portion of the first encapsulant remains covering the semiconductor die. Backgrinding the dummy die fully removes the dummy die while the second portion of the first encapsulant remains covering the semiconductor die. A second encapsulant is optionally deposited over the dummy die prior to disposing the dummy die over the carrier. A conductive pillar is optionally formed over the dummy die prior to depositing the second encapsulant. The carrier is removed to expose an active surface of the semiconductor die. A build-up interconnect structure is formed over the active surface after removing the carrier.

13 Claims, 10 Drawing Sheets

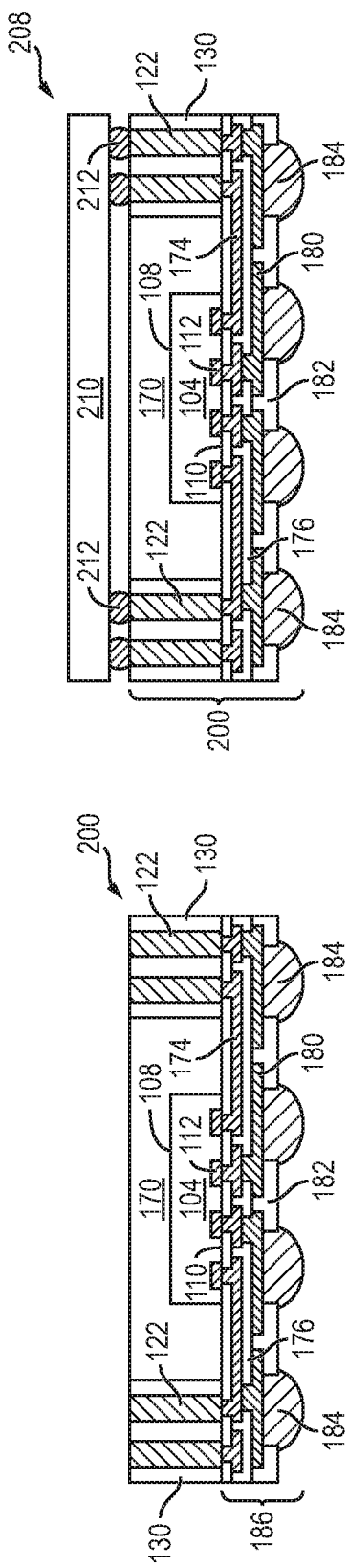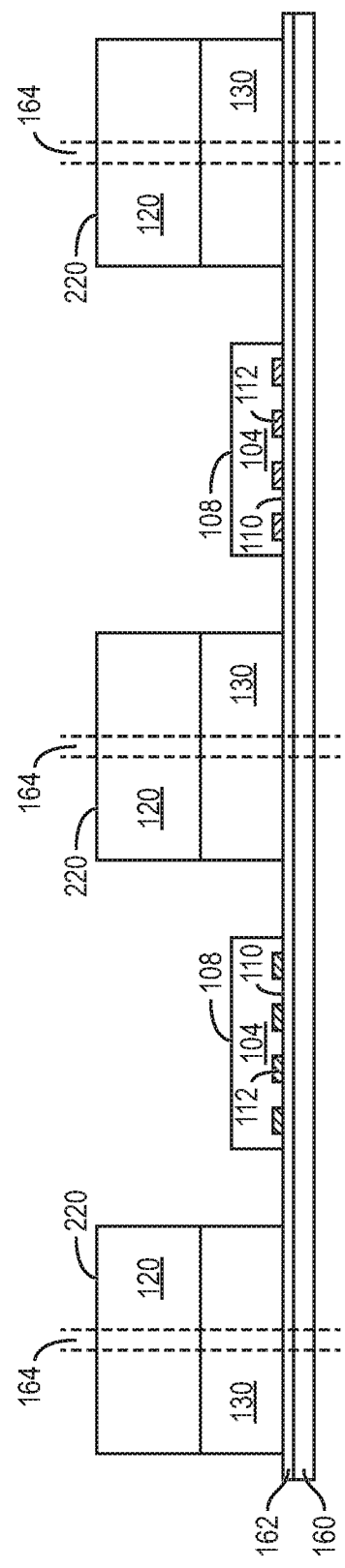

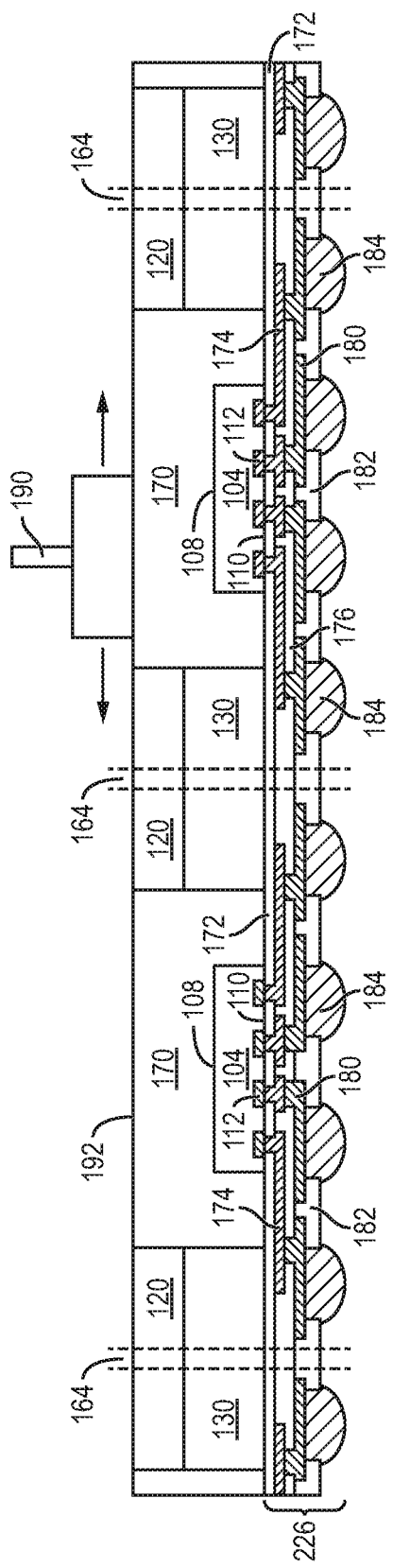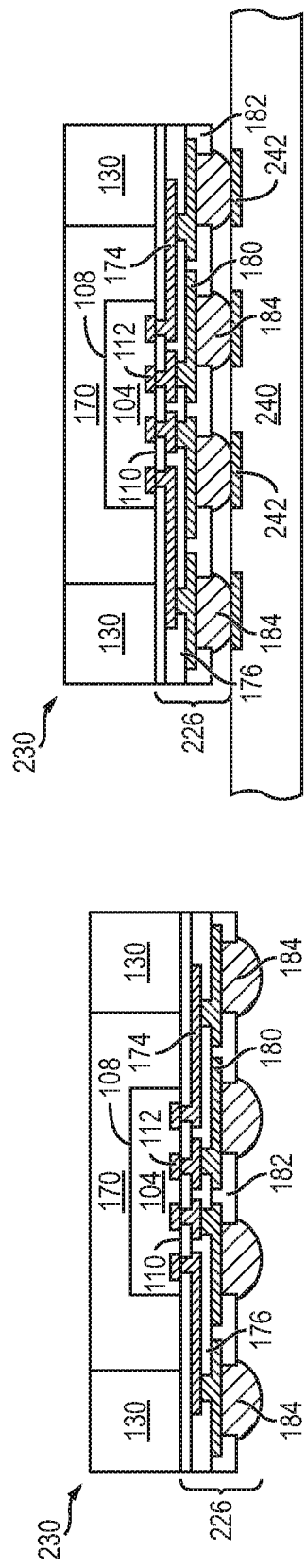

US 10,510,632 B2

METHOD OF PACKAGING THIN DIE AND SEMICONDUCTOR DEVICE INCLUDING THIN DIE

FIELD OF THE INVENTION

The present invention relates in general to semiconductor devices and, more particularly, a method of packaging a thin semiconductor die and a semiconductor device including a thin semiconductor die.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photoelectric generation, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor packages are being made smaller and smaller to satisfy consumer demand for smaller end products. Making semiconductor packages with a thinner profile requires using thinner semiconductor die within the packages. However, for packaging types that are made using reconstituted (recon) wafers, thin die make the recon wafers flexible. A reconstituted wafer is formed by spreading semiconductor die out on a carrier and then depositing encapsulant to reconnect the die physically. The encapsulated die appear similarly to an unsingulated semiconductor wafer, but have been reconstituted into new wafer connected by encapsulant. Conductive layers, referred to as redistribution layers, are formed over the semiconductor die and encapsulant for electrical interconnect. The recon wafer tends to warp when forming redistribution layers (RDL), or otherwise processing the recon wafer, if the semiconductor die are thin.

Thick die are commonly used in the recon wafer to reduce warpage when forming RDL. The reconstituted wafer is backgrinded after forming the RDL to reduce a thickness of the die, and package as a whole. Both the semiconductor die and encapsulant are grinded, which thins the semiconductor die down to a desired thickness. However, the semiconductor die is exposed from the package in the process, which could result in contamination of the die due to backgrinding the semiconductor material at the same time as other materials. In addition, the backgrinding may degrade the strength of the semiconductor material.

Therefore, a need exists for a recon wafer process using thin semiconductor die that can control warpage.

BRIEF DESCRIPTION OF THE DRAWINGS

FIG. 4 illustrates a semiconductor package singulated from the reconstituted wafer;

FIG. 5 illustrates a package-on-package configuration;

FIGS. 6a-6c illustrate forming semiconductor packages using dummy modular interconnect units in a reconstituted wafer; and FIGS. 7a and 7b illustrate integrating a semiconductor package into an electronic device.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribe lines. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
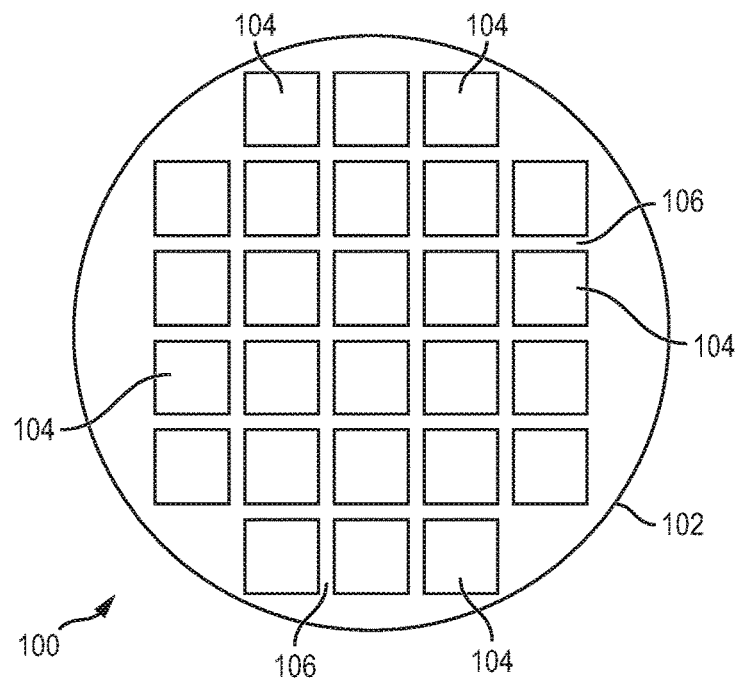
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
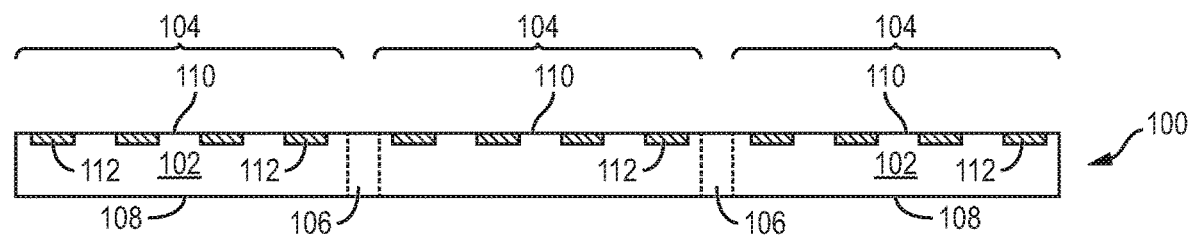

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuit (ASIC), memory, or other signal processing circuit. Semiconductor die 104 may also contain IPDs, such as inductors, capacitors, and resistors, formed in or on interconnect layers over surfaces of the semiconductor die for RF signal processing.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits of active surface 110. Conductive layer 112 can include conductive signal traces in addition to contact pads. In some embodiments, a plurality of insulating and conductive layers are formed over active surface 110 for signal routing.

Figure 1C:
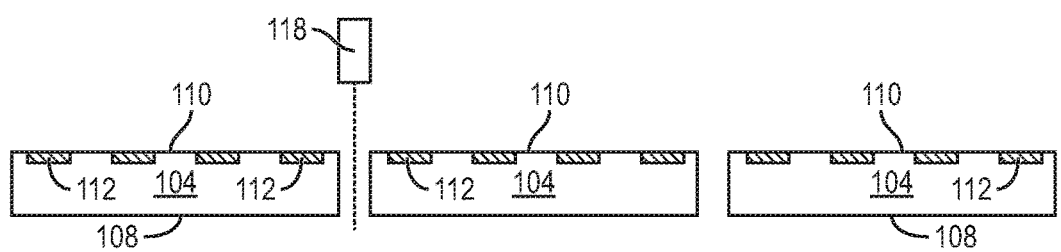

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) after singulation.

Figure 2A:
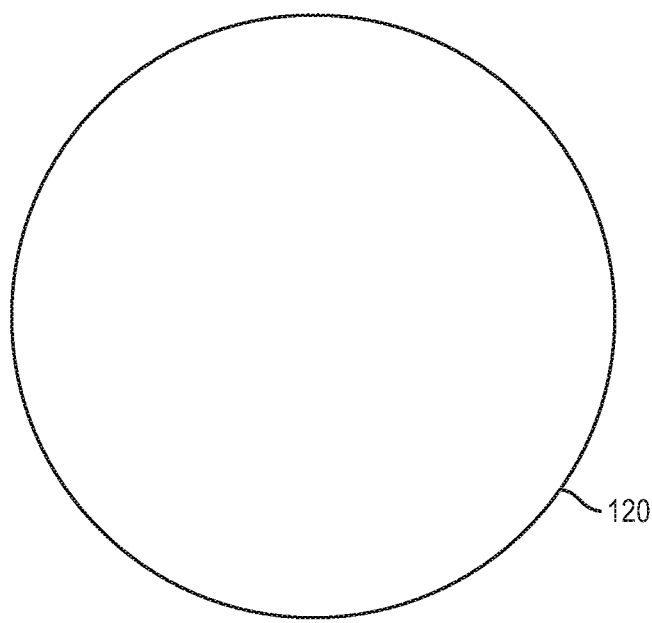
FIGS. 2a-2f illustrate formation of modular interconnect units on a dummy wafer.

FIGS. 2a-2f illustrate a process of forming modular interconnect units on a dummy wafer. The modular interconnect units will be used in a reconstituted (recon) wafer along with semiconductor die 104. FIG. 2a illustrates a sacrificial or dummy semiconductor wafer 120. Dummy wafer 120 is similar to semiconductor wafer 100, but generally does not have semiconductor die or other active devices formed in the wafer. Dummy wafer 120 is the same material as semiconductor die 104, e.g., both are silicon in one embodiment. In other embodiments, a different material is used for dummy wafer 120. Because dummy wafer 120 is sacrificial in the manufacturing process, the material for dummy wafer is not necessarily a semiconductor material suitable for semiconductor wafer 100. Polymer, beryllium oxide, glass, or other suitable low-cost, rigid material can be used for dummy wafer 120.

Figure 2B:
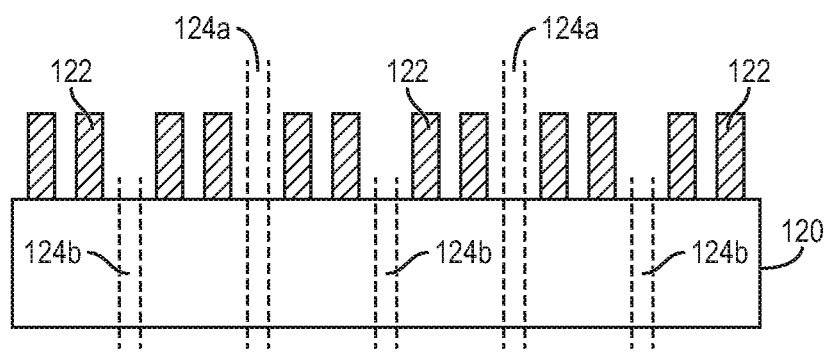

In FIG. 2b, a plurality of interconnect structures or conductive pillars 122 is formed on dummy wafer 120. A patterning or photoresist layer is formed over dummy wafer 120 using printing, spin coating, or spray coating. Portions of the photoresist layer are removed by developing the photoresist and etching to form openings or vias that extend down to and expose dummy wafer 120. Alternatively, openings are formed by laser direct ablation (LDA) or other suitable process. A conductive material is deposited into the photoresist openings using a metal deposition process such as evaporation, screen printing, sputtering, electrolytic plating, or electroless plating to form conductive pillars 122. The conductive material for conductive pillars 122 can be one or more layers of Al, Cu, Sn, Ti, Ni, Au, Ag, tungsten (W), or other suitable electrically conductive material. In some embodiments, a seed layer is used between dummy wafer 120 and conductive pillars 122. Remaining portions of the photoresist layer are removed by a chemical stripping or etching process to leave conductive pillars 122 extending over dummy wafer 120. Conductive pillars 122 are formed using any suitable process for forming a conductive pillar.

Conductive pillars 122 can have a cylindrical shape with a circular or oval cross-section, or conductive pillars 122 can have a cubic shape with a rectangular cross-section. Other shapes of conductive pillars 122 are used in other embodiments. Conductive pillars 122 are laid out over dummy wafer 120 with space between the pillars reserved for saw streets 124. Saw streets 124 are similar to saw streets 106, remaining devoid of conductive pillars 122 in lines across dummy wafer 120. Saw streets 124 give room to saw through dummy wafer 120 without also sawing through conductive pillars 122. Saw streets 124a are saw streets for singulating dummy wafer 120 into a plurality of units for inclusion in a recon wafer. Saw streets 124b are saw streets for subsequent singulation of the recon wafer. The units of dummy wafer 120 extend into two or more units of the recon wafer with saw streets 124b aligned along saw streets of the recon wafer. When the recon wafer is singulated, a saw or other tool cuts between pillars 122 at saw streets 124b.

Figure 2C:
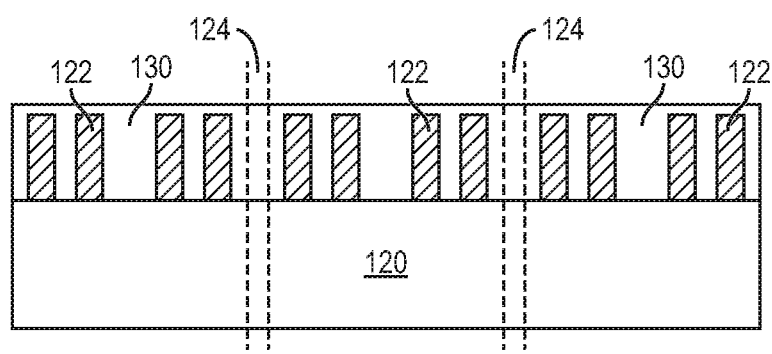

In FIG. 2c, an encapsulant or molding compound 130 is deposited over dummy wafer 120 and conductive pillars 122 as an insulating material using a paste printing, compressive molding, transfer molding, liquid encapsulant molding, vacuum lamination, spin coating, or other suitable applicator. Encapsulant 130 can be polymer composite material, such as epoxy resin, epoxy acrylate, or polymer with or without filler. Encapsulant 130 is non-conductive and provides structural support for conductive pillars 122. In some embodiments, encapsulant 130 is deposited to the same height as conductive pillars 122, e.g., by using film assisted molding. In FIG. 2c, conductive pillars 122 are completely covered, or overmolded, by encapsulant 130. Encapsulant 130 extends over the top of conductive pillars 122 opposite dummy wafer 120. In other embodiments, encapsulant 130 is deposited prior to forming conductive pillars 122 in openings of the encapsulant.

Figure 2D:
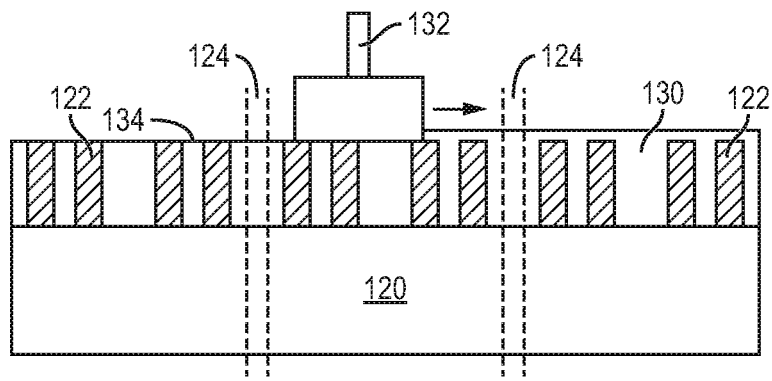

In embodiments where conductive pillars 122 are covered by encapsulant 130, the conductive pillars and encapsulant are planarized to expose the conductive pillars. FIG. 2d shows a backgrinding operation with grinder 132 or other suitable chemical or mechanical grinding or etching process to reduce a thickness of encapsulant 130 and expose conductive pillars 122. After backgrinding, a top surface 134 is substantially flat or planar across the entire width of dummy wafer 120, and approximately parallel with the bottom surfaces of encapsulant 130 and conductive pillars 122. The top surface of encapsulant 130 and the top surfaces of conductive pillars 122 are coplanar, and form surface 134 in combination. Portions of encapsulant 130 over conductive pillars 122 are removed by grinder 132 to expose pillars 122. In some embodiments, portions of conductive pillars 122 are removed by grinder 132, which helps ensure that all conductive pillars are exposed when the heights are not uniform.

Figure 2E:
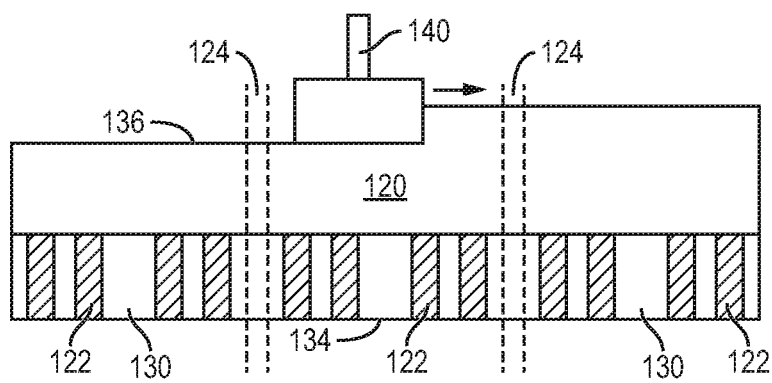

In FIG. 2e, dummy wafer 120 is optionally flipped and backgrinded with grinder 140. Grinder 140 can be the same grinder 132 from FIG. 2d, or any other suitable process for thinning a semiconductor wafer can be used. Backgrinding of dummy wafer 120 allows control of the volume ratio of semiconductor material to encapsulant in the recon wafer at later steps. Backgrinding of dummy wafer 120 leaves a back surface 136 that is planar across an entirety of the dummy wafer.

Figure 2F:
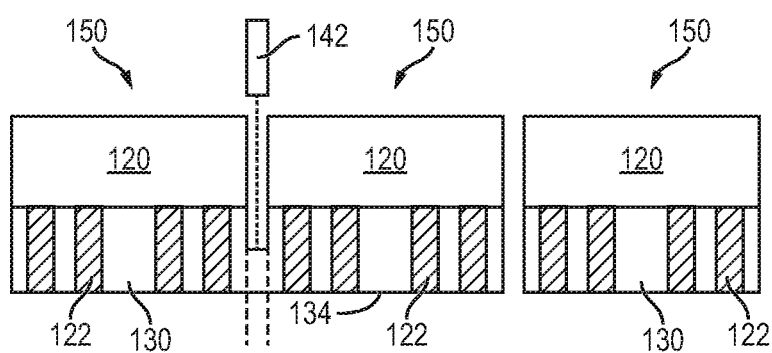

In FIG. 2f, dummy wafer 120 is singulated through saw streets 124 using laser cutting tool, saw blade, or water cutting tool 142 into a plurality of modular interconnect units 150. Dummy wafer 120 can be singulated into any pattern desired for use in recon wafers. The portions of dummy wafer 120 remaining after singulation will be referred to as dummy die 120. Any suitable pattern of conductive pillars 122 and size of modular interconnect units 150 can be used. The patterns and sizes depend on the number of interconnect signals needed, and whether or not the units will extend across saw streets in the recon wafers.

Figure 3A:
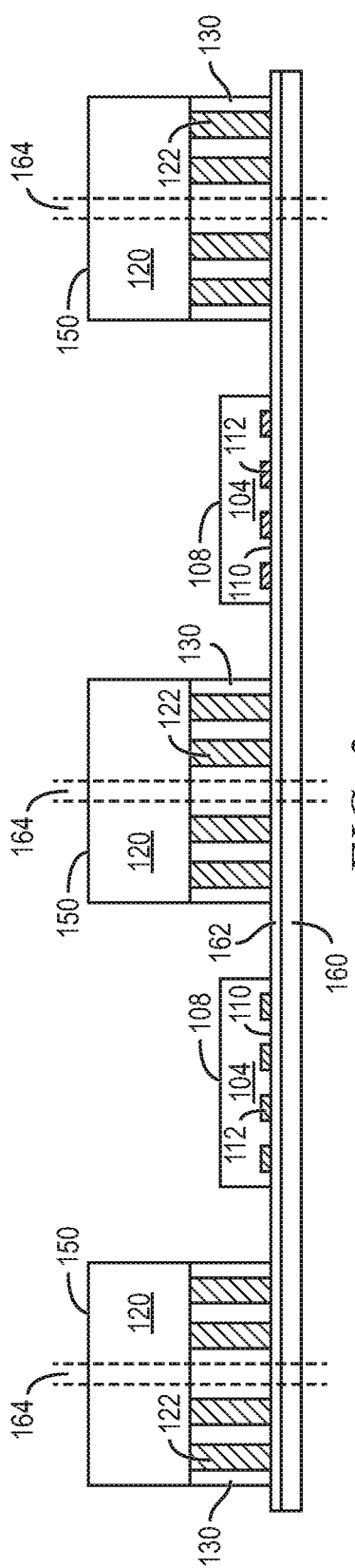
FIGS. 3a-3h illustrate forming semiconductor packages using the modular interconnect units and semiconductor die in a reconstituted wafer.

FIGS. 3a-3h illustrate forming semiconductor packages using recon wafers with modular interconnect units 150 and semiconductor die 104. FIG. 3a shows a cross-sectional view of a portion of a carrier or temporary substrate 160 containing sacrificial base material such as silicon, polymer, beryllium oxide, glass, or other suitable low-cost, rigid material for structural support. An interface layer or double-sided tape 162 is formed over carrier 160 as a temporary adhesive bonding film, etch-stop layer, or thermal release layer.

Carrier 160 can be a round or rectangular panel with capacity for many semiconductor die 104 and modular interconnect units 150. Carrier 160 may have a larger surface area than the surface area of semiconductor wafer 100. A larger carrier reduces the manufacturing cost of the semiconductor package as more semiconductor die can be processed on the larger carrier, thereby reducing the cost per unit.

Carrier 160 includes a plurality of areas for device formation separated by saw streets 164. A manufacturer disposes any desired devices to be packaged onto carrier 160 between saw streets 164. If desired, modular interconnect units 150 are disposed with saw streets 124b aligned to saw streets 164. During subsequent singulation of the larger devices being formed, modular interconnect units 150 are singulated between conductive pillars 122. In other embodiments, modular interconnect units 150 are disposed completely non-overlapping with saw streets 164. FIG. 3a illustrates a single semiconductor die 104 and part of two different modular interconnect structures 150 in each device formation area. However, any configuration of devices can be provided for packaging together, including multiple semiconductor die, discrete active or passive components, other configurations of modular interconnect units 150, etc.

Semiconductor die 104 and modular interconnect units 150 are disposed on carrier 160 using, e.g., a pick-and-place operation. Semiconductor die 104 are disposed with active surface 110 in contact with carrier 160 or interface layer 162. Surfaces of conductive pillars 122 and encapsulant 130 also contact carrier 160 or interface layer 162. Semiconductor die 104 and modular interconnect units 150 include bottom surfaces that are coplanar due to being disposed flat on the same planar surface of carrier 160. Conductive pillars 122 are tall enough over carrier 160 to extend to a height above the height of back surface 108 of semiconductor die 104. Semiconductor die 104 are located completely within the height of conductive pillars 122. Modular interconnect units 150 are disposed with dummy die 120 oriented away from the carrier and conductive pillars 122 contacting the carrier. The bottom surfaces of dummy die 120 are at a height over carrier 160 that is greater than back surfaces 108 of semiconductor die 104.

Figure 3B:
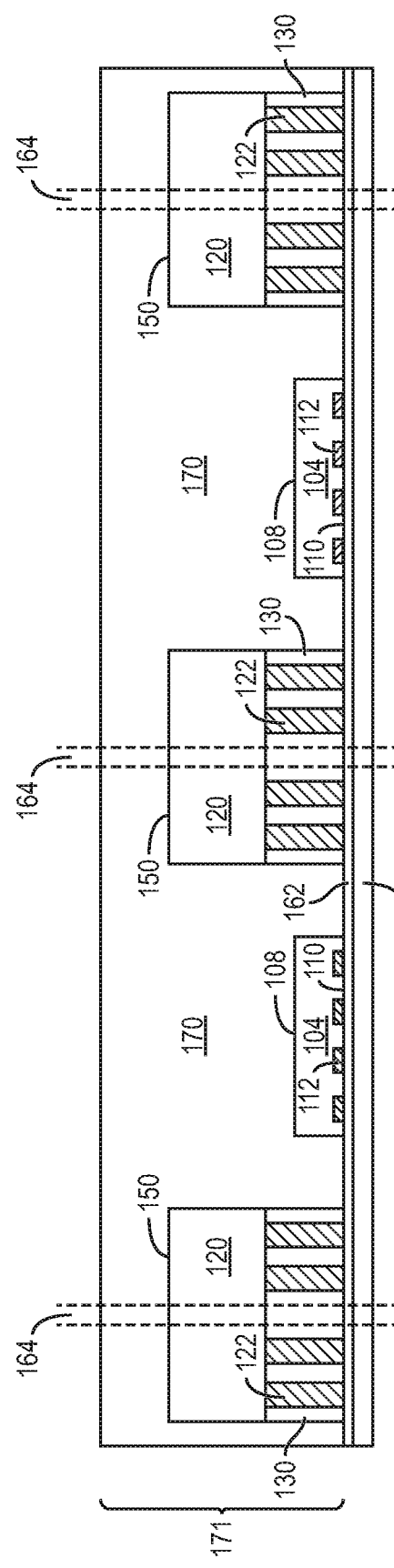

In FIG. 3b, encapsulant 170 is deposited in a similar manner as was encapsulant 130, and includes a similar molding compound. Encapsulant 170 completely covers semiconductor die 104 and modular interconnect units 150. In other embodiments, dummy die 120 remains exposed from encapsulant 170, e.g., by using film assisted molding. Encapsulant 170 can be the same molding compound material as used for encapsulant 130 to improve reliability and limit warpage.

Semiconductor die 104 and modular interconnect units 150 embedded in encapsulant 170 form a recon wafer 171. Semiconductor die 104 are relatively thin die, which commonly causes recon wafers to undergo warpage during subsequent processing. However, dummy die 120 are used to increase the proportion of the volume of recon wafer 171 that is composed of semiconductor material. The percentage of recon wafer 171 that is composed of semiconductor material can be controlled by changing the final thickness during backgrinding in FIG. 2e, by modifying the size of dummy die 120 singulated from the dummy wafer in FIG. 2f, or by modifying the density with which modular interconnect units 150 are disposed on carrier 160 in FIG. 3a. Increasing the amount of semiconductor material in recon wafer 171 reduces warpage during subsequent processing, allowing thinner die 104 to be used.

Figure 3C:
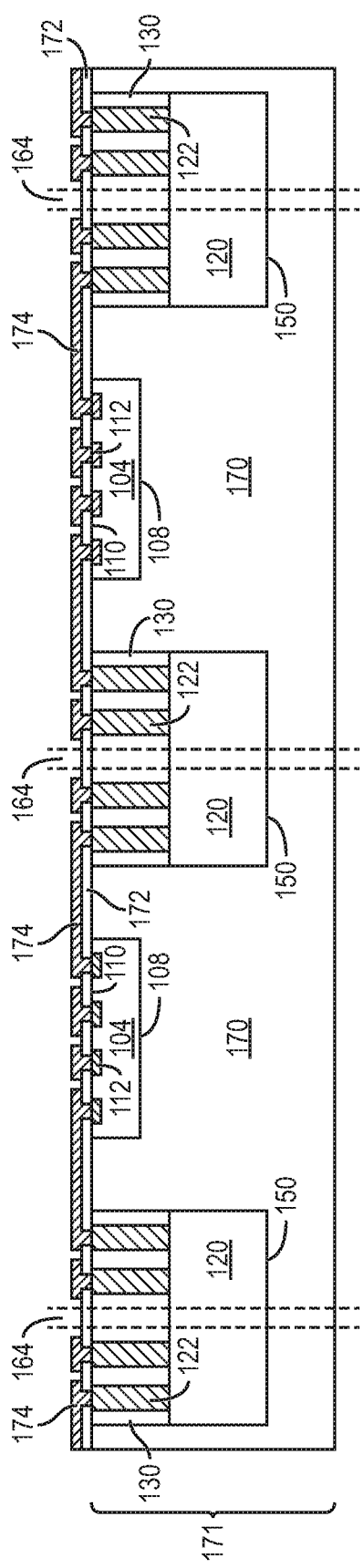

In FIG. 3c, carrier 160 and interface layer 162 are removed by chemical etching, mechanical peeling, chemical mechanical planarization (CMP), mechanical grinding, thermal bake, UV light, laser scanning, wet stripping, or another suitable procedure, to expose active surface 110 of semiconductor die 104, including conductive layer 112, as well as encapsulant 130 and conductive pillars 122 of modular interconnect units 150. In some embodiments, recon wafer 171 is disposed on a second carrier prior to or after removal of carrier 160.

An insulating or passivation layer 172 is formed over recon wafer 171. Insulating layer 172 contains one or more layers of SiO2, Si3N4, SiON, Ta2O5, Al2O3, or other material having similar insulating and structural properties. Portions of insulating layer 172 are removed by LDA, etching, or other suitable process to expose conductive layer 112 and conductive pillars 122 for subsequent electrical interconnect.

An electrically conductive layer 174 is formed over insulating layer 172 and reconstituted wafer 171 using PVD, CVD, electrolytic plating, electroless plating, or other suitable metal deposition process. Conductive layer 174 contains one or more layers of Al, Cu, Sn, Ni, Au, Ag, or other suitable electrically conductive material. In one embodiment, conductive layer 174 includes an adhesion or seed layer of Ti/Cu, TiW/Cu, or another coupling agent and Cu. Another metal with good wet etching selectivity, such as Ni, Au, or Ag, is optionally added to the seed layer. The seed layer is deposited by sputtering, electroless plating, or by depositing laminated Cu foil combined with electroless plating.

Conductive layer 174 is electrically connected to conductive layer 112 and conductive pillars 122 through openings in insulating layer 172. Portions of conductive layer 174 can be electrically common or electrically isolated depending on the design and function of semiconductor die 104, and operate as an RDL to fan-out and extend electrical connection from the semiconductor die. Conductive layer 174 typically includes conductive traces extending horizontally across recon wafer 171, conductive vias vertically through insulating layer 172, and contact pads for convenient connection by subsequently formed conductive layers. Some portions of conductive layer 174 typically connect semiconductor die 104 to conductive pillars 122.

Figure 3D:
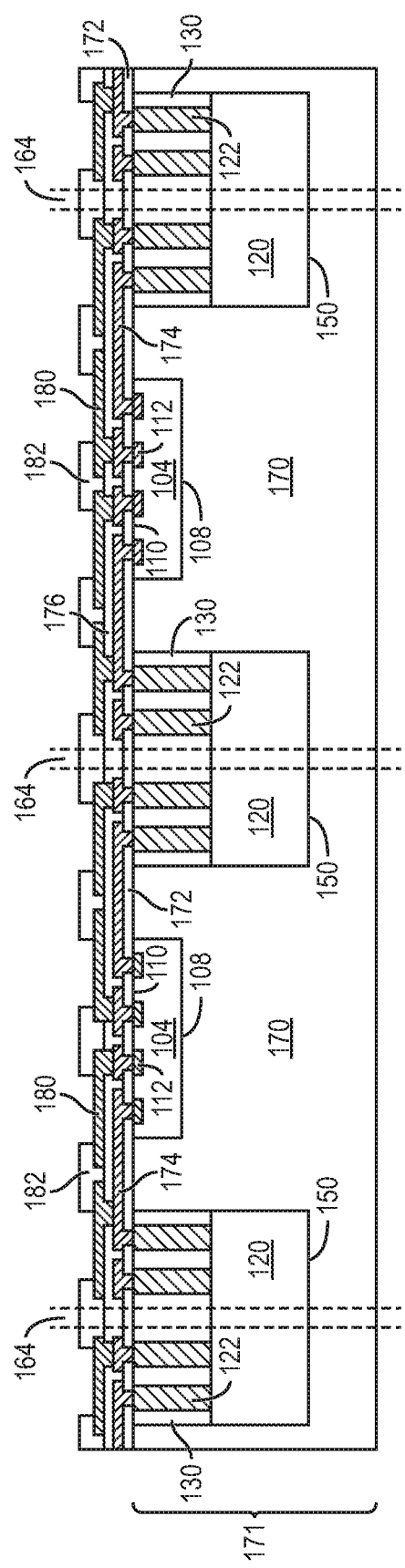

FIG. 3d illustrates an additional insulating layer 176, similar to insulating layer 172, and an additional conductive layer 180, similar to conductive layer 174. Any number of conductive and insulating layers can be interleaved over recon wafer 171 to accomplish a desired signal routing. An optional passivation layer 182 is formed over the top conductive layer 180 to protect the stack of conductive and insulating layers. A portion of passivation layer 182 is removed by LDA, etching, or other suitable process to expose conductive layer 180 for subsequent electrical interconnect.

Figure 3E:
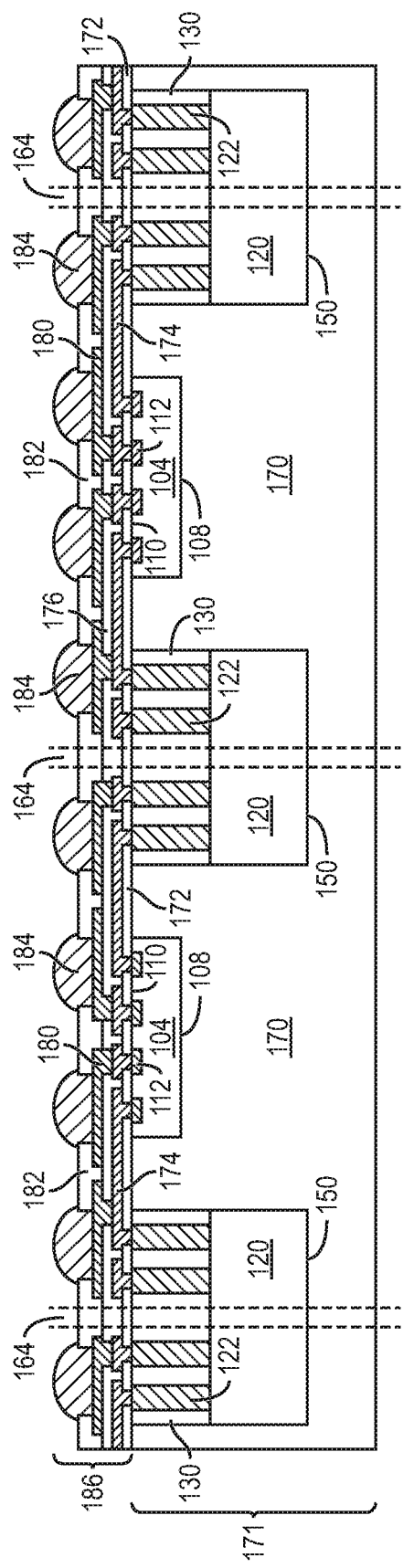

In FIG. 3e, an electrically conductive bump material is deposited over conductive layer 180, within the openings of passivation layer 182, using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 180 using a suitable attachment or bonding process. In one embodiment, the bump material is reflowed by heating the material above its melting point to form balls or bumps 184. In some applications, bumps 184 are reflowed a second time to improve electrical contact to conductive layer 180. In one embodiment, bumps 184 are formed over an under bump metallization (UBM) layer. Bumps 184 can also be compression bonded or thermocompression bonded to conductive layer 180. Bumps 184 represent one type of interconnect structure that can be formed over conductive layer 180. The interconnect structure can also use bond wires, conductive paste, stud bumps, micro bumps, or other electrical interconnect.

The stack of insulating layer 172, conductive layer 174, insulating layer 176, conductive layer 180, and passivation layer 182 constitutes a build-up interconnect structure 186. The term build-up interconnect structure refers to the process of "building up" build-up interconnect structure 186 on recon wafer 171 by successively forming insulating and conductive layers. Conductive bumps 184 may be considered as part of build-up interconnect structure 186, or as separate interconnect structures disposed on the build-up interconnect structure.

Figure 3F:
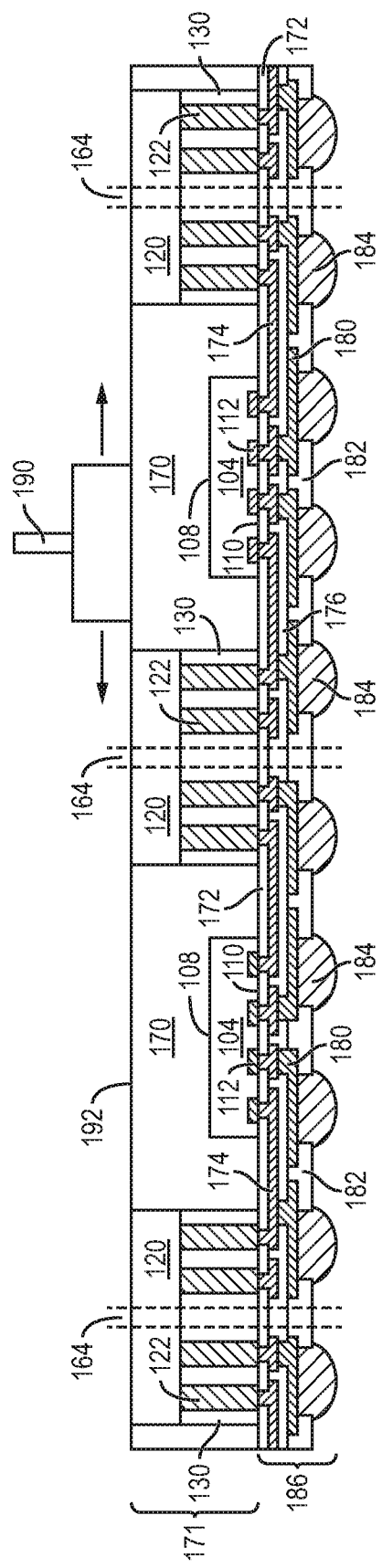

Recon wafer 171 includes dummy die 120 during formation of build-up interconnect structure 186, which helps to control warpage. Beginning in FIG. 3f, dummy die 120 are removed by backgrinding with grinder 190 to finish the packages. Grinding can also be by CMP or other suitable recon wafer thinning process. FIG. 3f illustrates recon wafer 171 in the middle of being thinned, while the level of grinding has created back surface 192 to the recon wafer. Back surface 192 is in the middle of the height of dummy die 120. Grinding at the stage shown in FIG. 3f is removing a portion of encapsulant 170 and a portion of dummy die 120. Semiconductor die 104 remain protected from contamination by encapsulant 170.

Figure 3G:
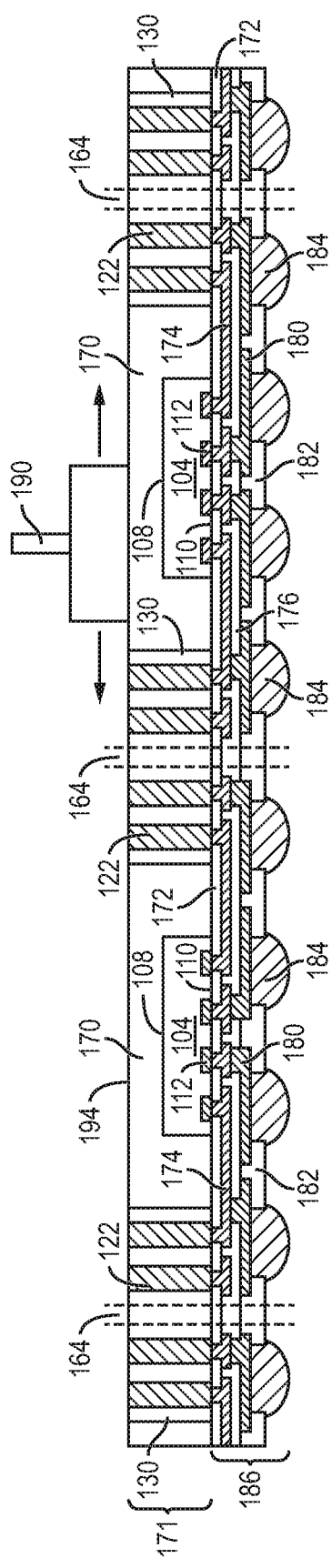

Grinding with grinder 190 proceeds until a final desired thickness is reached at back surface 194 in FIG. 3g. Recon wafer 171 is grinded sufficiently to expose conductive pillars 122 for electrical interconnect without exposing semiconductor die 104. Grinding of surface 194 removes a portion of conductive pillars 122, and encapsulants 130 and 170. Grinder 190 tends to smear conductive particles from conductive pillars 122 across back surface 194. Semiconductor die 104 remains protected by encapsulant 170 so that the particles of conductive pillars 122 are unlikely to contaminate the semiconductor die. Back surface 194 includes back surfaces of encapsulant 170, encapsulant 130, and conductive pillars 122, which are all coplanar. Encapsulant 170 fully surrounds encapsulant 130 such that encapsulant 130 is exposed at front and back, or top and bottom, surfaces of encapsulant 170, but all side surfaces of encapsulant 130 are covered by encapsulant 170. In one embodiment, encapsulant 130 is a rectangle in plan view, and encapsulant 130 has four side surfaces covered by encapsulant 170.

In the prior art, where thicker semiconductor die were used, and then backgrinded during the present manufacturing stage, particles from conductive pillars 122 commonly became embedded within the semiconductor die. The contamination has potential to cause defects in the final devices, especially as the semiconductor die are grinded thinner and thinner. Using semiconductor die 104, which is already thin prior to being disposed in recon wafer 171, keeps the semiconductor die covered in encapsulant 170 to protect from contamination during grinding. Warpage is controlled by adding dummy die 120 as part of modular interconnect structures 150 rather than by using a larger semiconductor die 104 as in the prior art.

Back surface 194, at the final thickness of recon wafer 171, includes coplanar top surfaces of conductive pillars 122, encapsulant 130, and encapsulant 170. The top surface of encapsulant 130 extends across and above the entirety of back surface 108 of semiconductor die 104. In some embodiments, a build-up interconnect structure including one or more RDL, similar to build-up interconnect structure 186, is formed over back surface 194 for signal routing and more convenient mounting of a top package in a package-on-package configuration.

Figure 3H:
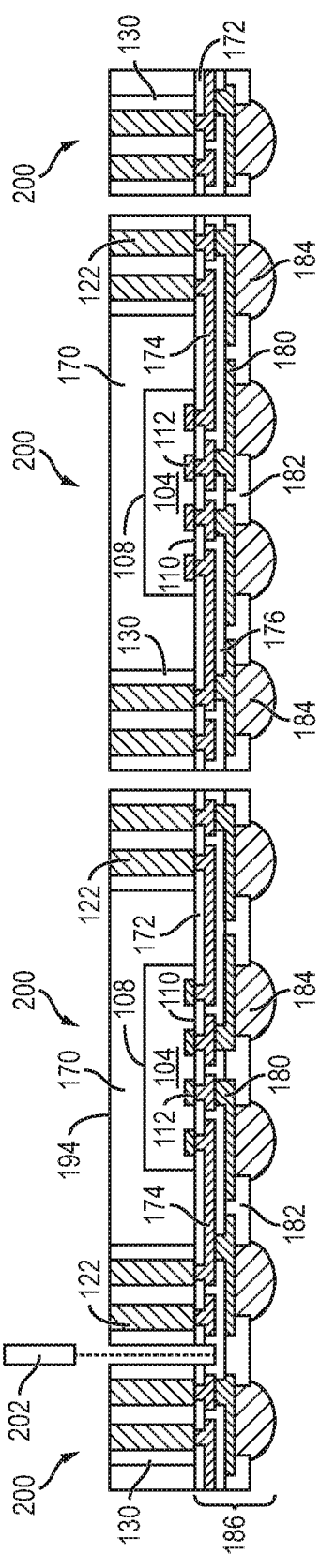

In FIG. 3h, recon wafer 171 is singulated into individual packages 200 through encapsulant 130 and build-up interconnect structure 186 with saw blade or laser cutting tool 202. Singulation exposes a side surface of encapsulant 130 from encapsulant 170. The resultant individual devices 200 include encapsulant 170 extending to the side surfaces of the device in other cross-sectional views that are taken outside of encapsulant 130, such that the side surfaces of devices 200 include encapsulant 130 surrounded by encapsulant 170. FIG. 4 shows a package 200 after singulation. Semiconductor die 104 remains covered in encapsulant 170. Any remaining stray particles from grinding of conductive pillars 122 are embedded in encapsulant 170 or encapsulant 130, a safe distance from semiconductor die 104. Using modular interconnect units 150 with dummy die 120 allows use of thinner semiconductor die 104 without exposing the die backside. A temporary carrier for the semiconductor die is not needed. Co-grinding of copper and silicon is avoided to reduce the risk of cross-contamination.

Semiconductor die 104 is electrically connected to conductive pillars 122 and conductive bumps 184 by conductive layers 174 and 180. Conductive bumps 184 are used to mount package 200 onto the substrate or PCB of a larger electronic device. Conductive pillars 122 allow connection of another semiconductor component 210, as seen in FIG. 5 with package-on-package 208. Semiconductor component 210 can be another semiconductor package of any suitable type, a bare semiconductor die, a discrete active or passive component, or any other electrical component usable with semiconductor die 104.

Semiconductor component 210 includes electrical signal routing to place contact pads or other terminals near the edges of the component, thus being aligned with conductive pillars 122. In other embodiments, signal routing is provided by forming one or more RDL over the back surface of package 200, and terminals of semiconductor component 210 are spread out over the entire bottom surface of the semiconductor component. Conductive bumps 212 are reflowed between semiconductor component 210 and conductive pillars 122 for mechanical bonding and electrical interconnection. Semiconductor component 210 is electrically connected to conductive bumps 184 and semiconductor die 104 through conductive bumps 212, conductive pillars 122, conductive layer 174, and conductive layer 180.

Conductive pillars 122 provide vertical interconnection through package 200 to allow package 200 to operate as the bottom package in a package-on-package configuration. However, in other embodiments, having electrical conductors exposed at the back surface of a package is undesirable. FIGS. 6a-6c illustrate forming a package with a similar process to the above, but without conductive pillars 122.

In FIG. 6a, semiconductor die 104 and dummy units 220 are disposed on carrier 160, similar to the step illustrated in FIG. 3a. Dummy units 220 include dummy die 120 and encapsulant 130 as with modular interconnect units 150, and are disposed with the encapsulant contacting carrier 160 between the carrier and the dummy die. Dummy units 220 are formed in a similar manner to modular interconnect units 150 in FIGS. 2a-2f, i.e., by depositing encapsulant 130 over dummy wafer 120 and then singulating. The difference being that when encapsulant 130 is deposited for dummy units 220, similar to FIG. 2c, no conductive pillars 122 were previously formed on dummy wafer 120. Encapsulant 130 is used to form what could be called dummy molding compound blocks. Encapsulant 130 in dummy units 220 is not provided for any reason related to electrical interconnection, but is simply used to raise dummy die 120 to a level above carrier 160 higher than back surface 108 of semiconductor die 104.

In FIG. 6b, encapsulant 170 is disposed over dummy units 220 and semiconductor die 104, as in FIG. 3b. Build-up interconnect structure 226 is formed over the recon wafer, similar to build-up interconnect structure 186 in FIGS. 3c-3e. Build-up interconnect structure 226 can be identical to structure 186 above, or can simply fan-out from semiconductor die 104 without having vias to encapsulant 130, as illustrated in FIG. 6b. Dummy units 220 with dummy die 120 are present when build-up interconnect structure 226 is formed, which helps limit warpage during processing. Encapsulant 170 and dummy die 120 are backgrinded using grinder 190, as in FIGS. 3f-3g, until encapsulant 130 is reached. Grinder 190 is able to completely remove dummy die 120 without reaching semiconductor die 104 because encapsulant 130 provides an offset between build-up interconnect structure 226 and dummy die 120 that is greater than a thickness of semiconductor die 104.

The recon wafer is singulated as in FIG. 3h to create a plurality of packages 230. FIG. 6c illustrates a package 230 after singulation. Encapsulant 130 is exposed at the top surface of package 230 due to grinder 190 completely removing dummy die 120 and exposing encapsulant 130. Encapsulant 130 is exposed at the side surfaces of packages 230 due to singulation of the recon wafer through dummy units 220. In other embodiments, dummy units 220 are not placed across saw streets of the recon wafer, and side surfaces of encapsulant 130 are not exposed in the final package. When the same molding compound material is used for both encapsulants 130 and 170, the delineation between the two may not be visible in the final package.

In some embodiments, dummy die 120 are used without encapsulant 130. Dummy die 120 can be disposed directly on carrier 160 to control the volume ratio of semiconductor material to encapsulant. Dummy die 120 are made taller than semiconductor die 104 so that the dummy die are backgrinded to a desired final thickness of the package by grinder 190 without reaching semiconductor die 104. Using only dummy die 120 without encapsulant 130 provides the benefits of reduced warpage and ability to use a thinner semiconductor die 104 without exposing the semiconductor die during backgrinding.

Figure 7B:
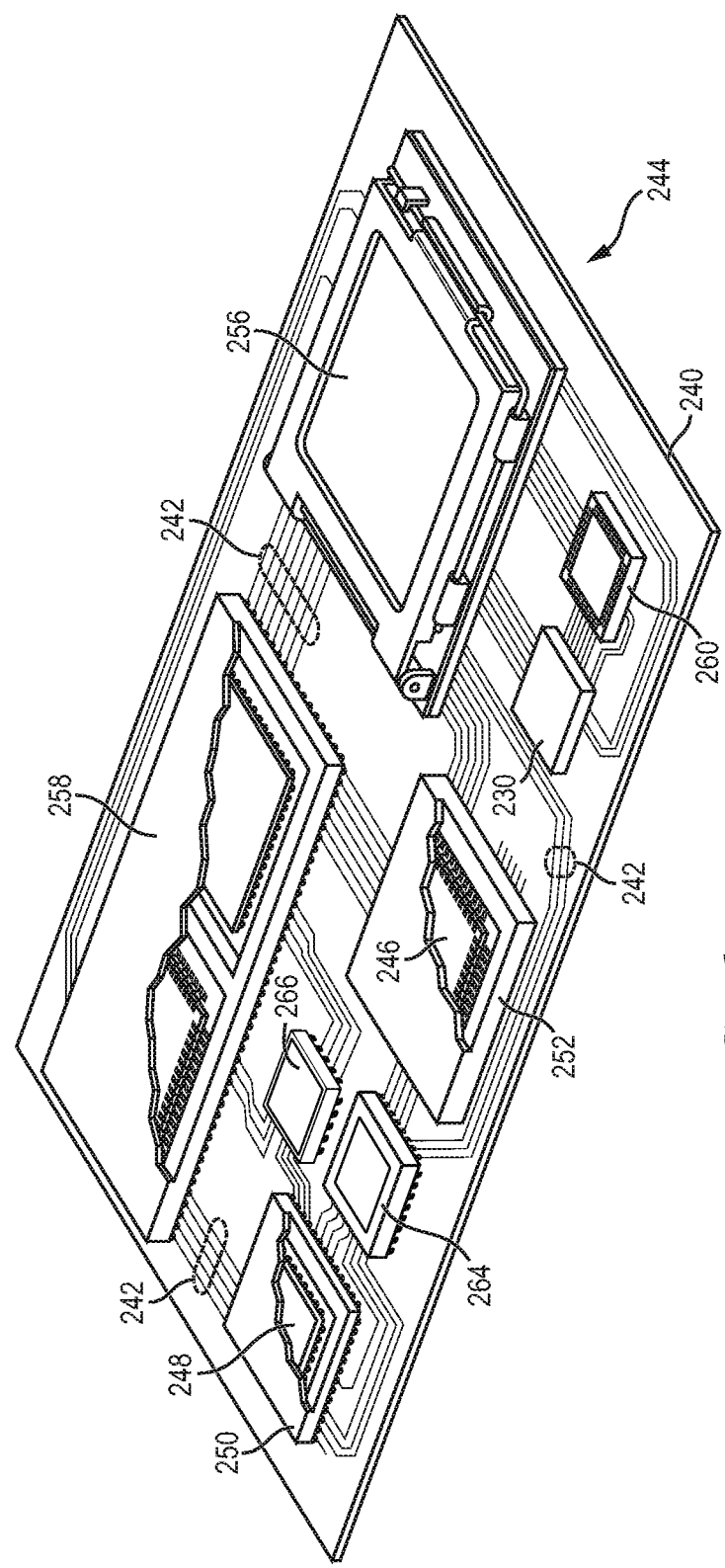

FIGS. 7a and 7b illustrate incorporating the above described packages, e.g., package 200, package-on-package 208, or package 230, into an electronic device. FIG. 7a illustrates a partial cross-section of package 230 from FIG. 6c mounted onto a PCB or other substrate 240 as part of an electronic device. Bumps 184 are reflowed onto conductive layer 242 of PCB 240 to physically attach and electrically connect package 230 to the PCB. In other embodiments, thermocompression or other suitable attachment and connection methods are used. In some embodiments, an adhesive or underfill layer is used between package 230 and PCB 240. Semiconductor die 104 is electrically coupled to conductive layer 242 through bumps 184 and build-up interconnect structure 186.

FIG. 7b illustrates electronic device 244 including PCB 240 with a plurality of semiconductor packages mounted on a surface of the PCB, including package 230. Electronic device 244 can have one type of semiconductor package, or multiple types of semiconductor packages, depending on the application.

Electronic device 244 can be a stand-alone system that uses the semiconductor packages to perform one or more electrical functions. Alternatively, electronic device 244 can be a subcomponent of a larger system. For example, electronic device 244 can be part of a tablet computer, cellular phone, digital camera, communication system, or other electronic device. Electronic device 244 can also be a graphics card, network interface card, or other signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 240 provides a general substrate for structural support and electrical interconnection of the semiconductor packages mounted on the PCB. Conductive signal traces 242 are formed over a surface or within layers of PCB 240 using evaporation, electrolytic plating, electroless plating, screen printing, or other suitable metal deposition process. Signal traces 242 provide for electrical communication between the semiconductor packages, mounted components, and other external systems or components. Traces 242 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 240. In other embodiments, a semiconductor device may only have the first level packaging where the die is mechanically and electrically mounted directly to PCB 240.

For the purpose of illustration, several types of first level packaging, including bond wire package 246 and flipchip 248, are shown on PCB 240. Additionally, several types of second level packaging, including ball grid array (BGA) 250, bump chip carrier (BCC) 252, land grid array (LGA) 256, multi-chip module (MCM) 258, quad flat non-leaded package (QFN) 260, embedded wafer level ball grid array (eWLB) 264, and wafer level chip scale package (WLCSP) 266 are shown mounted on PCB 240 along with package 230. In one embodiment, eWLB 264 is a fan-out wafer level package (Fo-WLP) and WLCSP 266 is a fan-in wafer level package (Fi-WLP). Conductive traces 242 electrically couple the various packages and components disposed on PCB 240 to package 230, giving use of the components within package 230 to other components on the PCB.

Depending upon the system requirements, any combination of semiconductor packages, configured with any combination of first and second level packaging styles, as well as other electronic components, can be connected to PCB 240. In some embodiments, electronic device 244 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   disposing a semiconductor die over the carrier;
   disposing a dummy die over the carrier;
   depositing a first encapsulant over the semiconductor die and dummy die; and
   backgrinding the dummy die and a first portion of the first encapsulant while a second portion of the first encapsulant remains covering the semiconductor die.

2. The method of claim 1, further including:
   depositing a second encapsulant over the dummy die prior to disposing the dummy die over the carrier; and
   backgrinding the dummy die to expose the second encapsulant.

3. The method of claim 2, further including:
   forming a conductive pillar over the dummy die prior to depositing the second encapsulant; and
   backgrinding the dummy die to expose the second encapsulant and conductive pillar.

4. The method of claim 1, further including:
   removing the carrier to expose an active surface of the semiconductor die; and
   forming a build-up interconnect structure over the active surface after removing the carrier.

5. The method of claim 4, further including backgrinding the dummy die and the first portion of the first encapsulant after forming the build-up interconnect structure.

6. The method of claim 1, wherein backgrinding the dummy die fully removes the dummy die while the second portion of the first encapsulant remains covering the semiconductor die.

7. A method of making a semiconductor device, comprising:
   providing a semiconductor die;
   disposing a dummy die adjacent to the semiconductor die;
   depositing a first encapsulant over the semiconductor die and dummy die; and
   backgrinding the dummy die and encapsulant while the encapsulant remains covering the semiconductor die.

8. The method of claim 7, further including depositing a second encapsulant over the dummy die, wherein a height of the second encapsulant is greater than a height of the semiconductor die.

9. The method of claim 7, further including forming an interconnect structure over the dummy die, wherein a height of the interconnect structure is greater than a height of the semiconductor die.

10. The method of claim 9, further including disposing a semiconductor component over the semiconductor die and electrically connected to the semiconductor die through the interconnect structure.

11. The method of claim 7, further including backgrinding to completely remove the dummy die while the encapsulant remains covering the semiconductor die.

12. The method of claim 7, further including forming a build-up interconnect structure over the semiconductor die and first encapsulant prior to backgrinding the dummy die.

13. The method of claim 12, further including disposing the semiconductor die and dummy die on a carrier prior to depositing the first encapsulant.

* * * * *